United States Patent [19]
Welch et al.

[11] Patent Number: 5,003,550
[45] Date of Patent: Mar. 26, 1991

[54] INTEGRATED LASER-AMPLIFIER WITH STEERABLE BEAM

[75] Inventors: David F. Welch, San Jose; Robert G. Waarts, Palo Alto; David G. Mehuys, Mountain View; Richard R. Craig, San Jose, all of Calif.

[73] Assignee: Spectra Diode Laboratories, Inc., San Jose, Calif.

[21] Appl. No.: 494,620

[22] Filed: Mar. 9, 1990

[51] Int. Cl.$^5$ ............................................... H01S 3/19
[52] U.S. Cl. ..................................... 372/50; 372/102; 372/45
[58] Field of Search ........................... 372/45, 56, 102

[56] References Cited

U.S. PATENT DOCUMENTS

| | | | |
|---|---|---|---|
| 4,713,821 | 12/1987 | Bradford et al. | 372/44 |
| 4,744,089 | 5/1988 | Montroll et al. | 372/50 |
| 4,747,650 | 5/1988 | Sakuda | 350/96.14 |
| 4,794,346 | 12/1988 | Miller | 330/4.3 |
| 4,856,017 | 8/1989 | Unagar | 372/50 |
| 4,872,176 | 10/1989 | Hammer | 372/50 |

Primary Examiner—Léon Scott, Jr.
Attorney, Agent, or Firm—Schneck & McHugh

[57] ABSTRACT

A monolithic integrated master oscillator power amplifier (MOPA) device including a single mode diode laser with distributed Bragg reflectors, an amplifier in tandem with the laser, lateral phase controllers and a detuned second order grating surface output coupler, all on a common substrate. The amplifier is a flared waveguide in one embodiment, and a branching network of single mode waveguides followed by an array of single mode gain waveguides in another embodiment. The diode laser is tunable by means of a separate tuning current applied to the rear Bragg reflector. Tuning the laser wavelength provides, in conjunction with the output coupler, a longitudinal steering of the output beam. The lateral phase controllers are an array of separately addressable electrodes that adjust the optical path length to compensate for phase variation in the amplifiers and also to provide lateral steering of the output beam. An additional embodiment includes a chain of amplifiers and grating output couplers for providing multiple output beams.

41 Claims, 4 Drawing Sheets

FIG._1

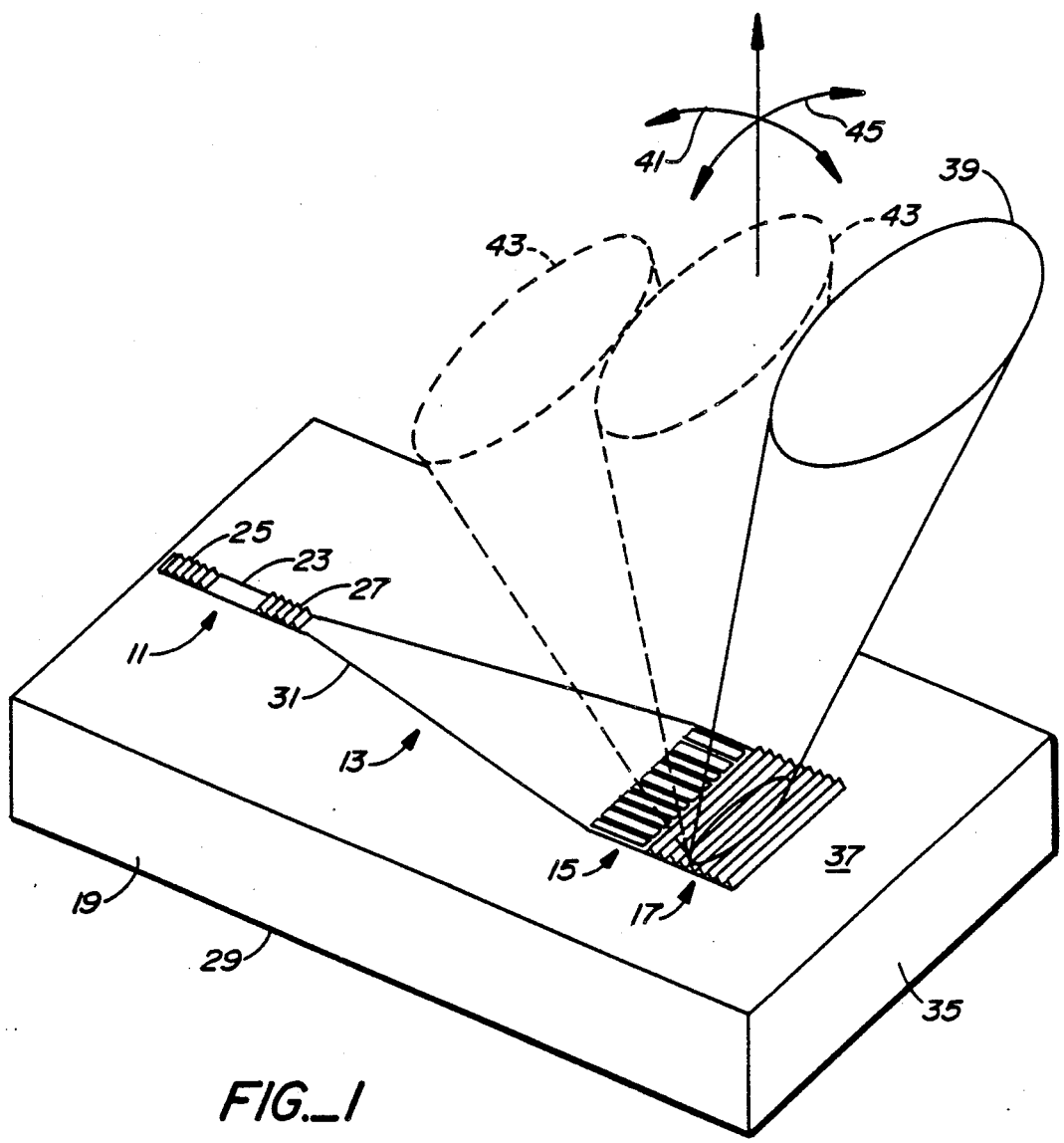
FIG._1

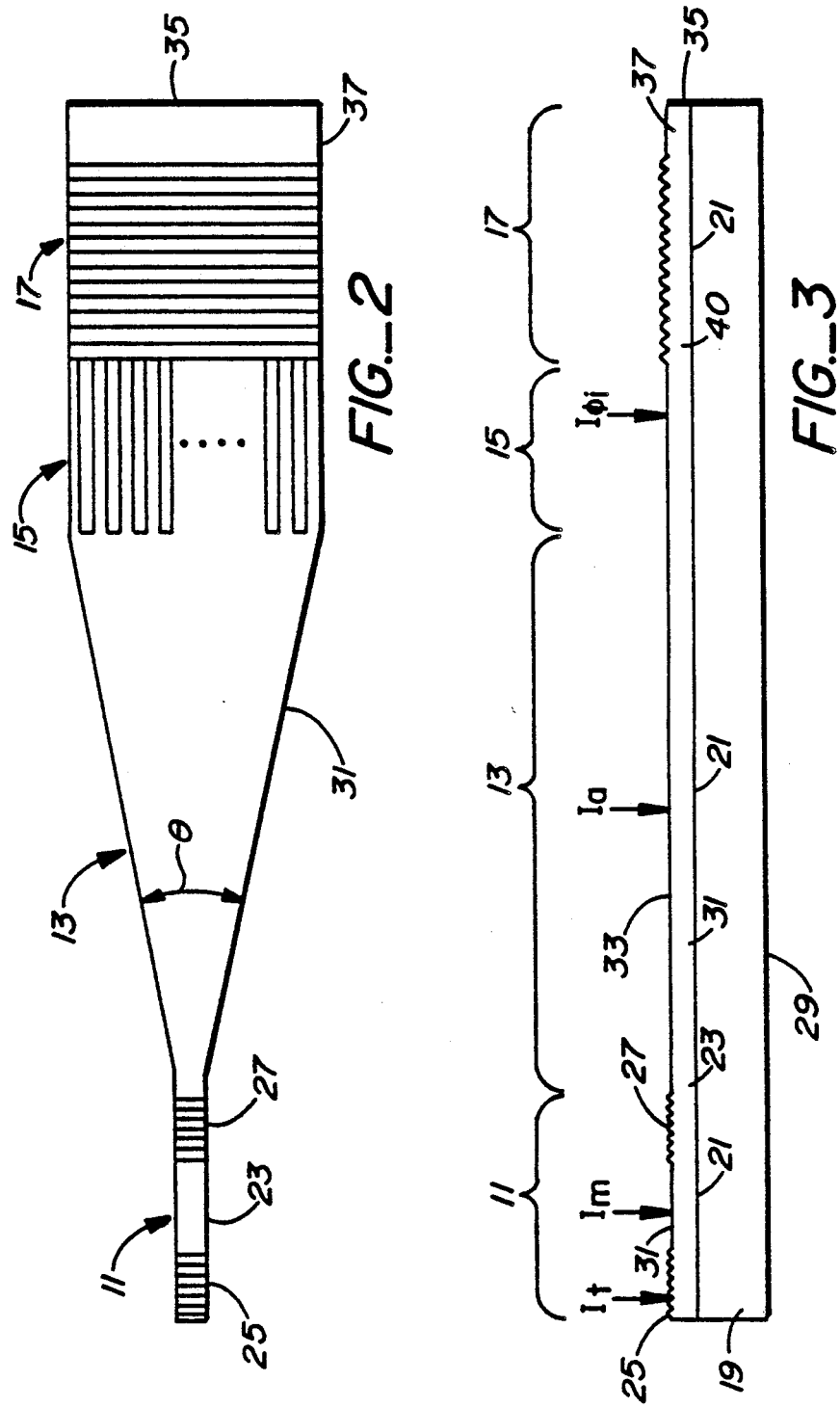

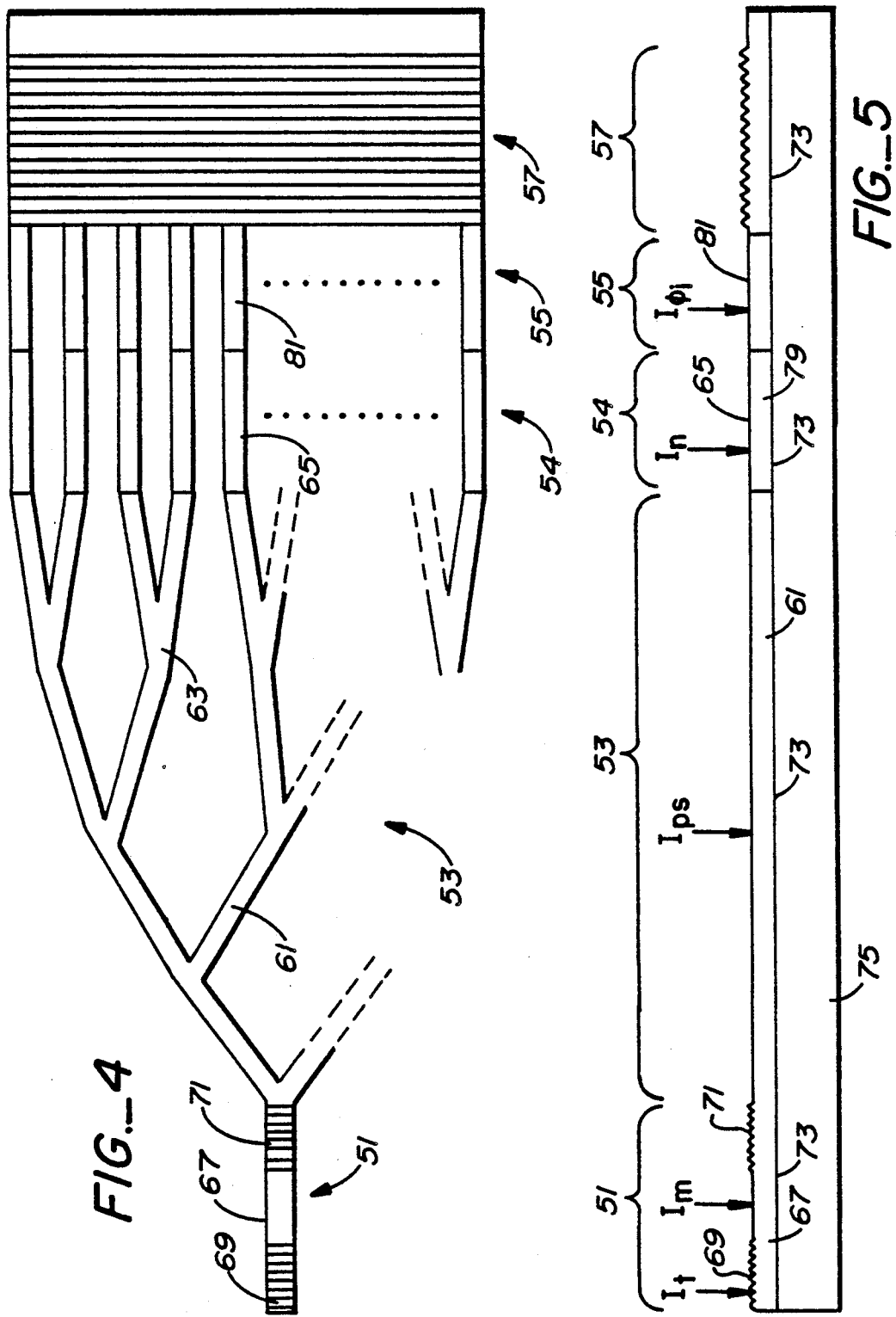

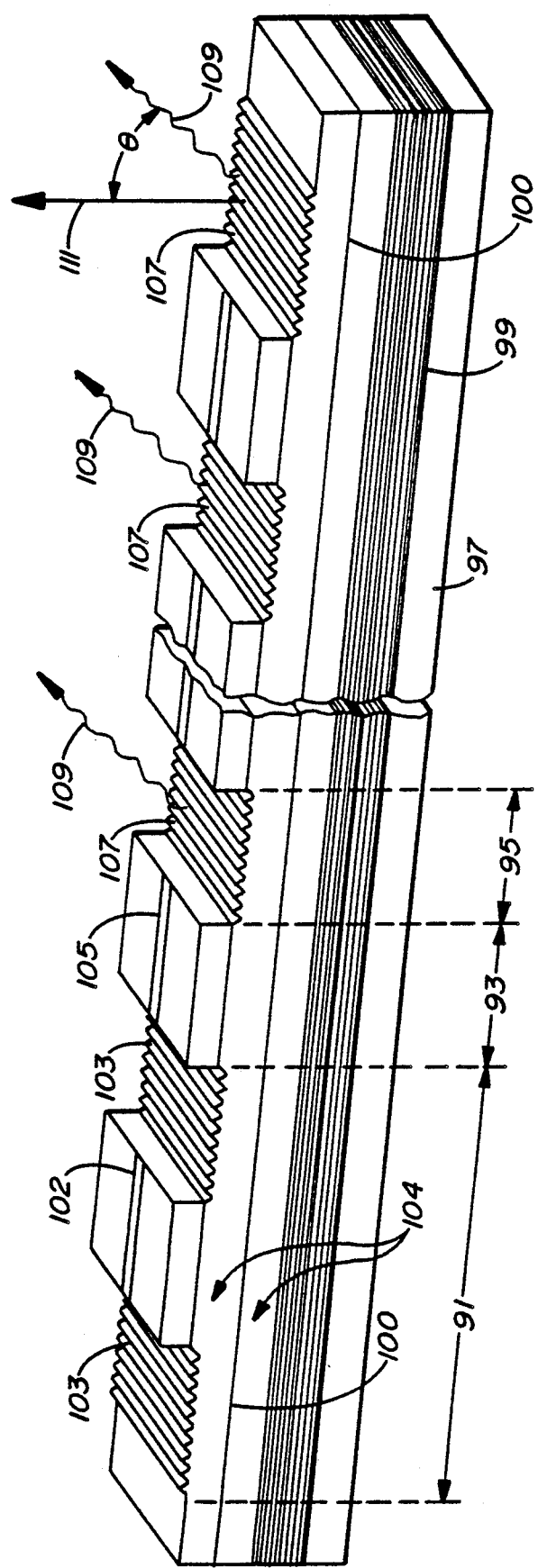
FIG._6

INTEGRATED LASER-AMPLIFIER WITH STEERABLE BEAM

Statement as to Rights to Inventions Made Under Federally Sponsored Research and Development The invention was made with government support under contract no. F29601-87-C-0028 awarded by the U.S. Air Force. The government has certain rights in the invention.

TECHNICAL FIELD

The present invention relates to high power semiconductor diode laser configurations, and in particular to configurations having a diode laser oscillator element monolithically integrated with an optical power amplifier element.

BACKGROUND ART

Semiconductor diode lasers are useful for a wide variety of applications, such as fiberoptic communications and optical data retrieval. Some potential applications, such as optical space communications, optical recording, semiconductor processing, spectrum analysis, laser radar, range finding and contour mapping, require high power, single spectral and spatial mode optical sources. Unfortunately, presently available diode laser configurations have difficulty in achieving both high power and a diffraction limited single mode beam in a single device. Diffraction limited single mode lasers are commercially available with an output power of 100 mW cw.

Phased array lasers are capable of achieving higher power. For example, a 10 W cw laser bar is commercially available. However, phased array lasers, in general, tend to have poor modal discrimination due to a variety of causes, including gain nonlinearities and spatial hole burning. These lasers operate in a diffraction limited single mode at low to moderate output powers, but as multimode oscillators at high power, some even at currents only slightly above threshold. Laser arrays that are most successful at maintaining a diffraction limited output do so only by suppressing other more favored modes, thereby limiting the achievable output.

The master oscillator power amplifier (MOPA) system is one structure that has been studied as having the potential to provide both high power and a diffraction limited single mode output. A MOPA with discrete oscillator and amplifier elements is described by Bradford et al. in U.S. Pat. No. 4,713,821. The MOPA includes a semiconductor laser diode having an output facet optically coupled to an optical power amplifier. The diode and amplifier are formed together as a single integral crystal, then cleaved to form a crack or division between the two. The diode and amplifier remain essentially a single unit in optical alignment with only a slight longitudinal shift resulting from the cleave. The active region at the entrance to the amplifier has the same lateral dimension as the active region at the exit of the laser diode, and the lateral dimension increases linearly in the forward direction toward the exit facet. The exit facet of the amplifier is antireflection coated.

In practice, MOPA structures with discrete elements are difficult to make, because the laser and amplifier must be mounted in precise alignment with close tolerances in order to achieve optical coupling. Further, even when alignment is achieved there are still substantial coupling losses to the amplifier because of the reflectivity of the entrance facet of the amplifier. Also, residual reflections of the amplifier excite self-oscillation in the amplifier, quenching the gain that is intended to be used by the laser output. As a result, a 100 mW cw diffraction limited output is the maximum limit.

In U.S. Pat. No. 4,744,089 to Montroll et al., an improved MOPA structure is described which requires no cleaving into separate elements, and is therefore monolithic. A laser diode has a periodic grating providing distributed feedback. A power amplifier with a diverging active area follows the laser, and the amplifier output facet is made antireflecting. The laser and amplifier are formed with separate electrical contacts so they can be driven by independent current sources. A power output of 1 W cw is achieved.

Feedback from the amplifier output facet must be minimized to allow the amplifier to be operated at high gain without parasitic oscillation deteriorating the spectral coherence of the device. In the MOPA structures described above, this is accomplished with an antireflection coating on the output facet. Unfortunately, a reflectivity below 0.001 is required and a reflectivity on the order of 0.0001 is preferred. Such low reflectivities are only achieved with difficulty with high quality dielectric coatings.

It is an object of the present invention to provide a monolithic master oscillator power amplifier (MOPA) structure which achieves both high power and diffraction limited, single spatial and spectral mode output beam.

It is another object to provide a MOPA structure in which the output beam is steerable.

DISCLOSURE OF THE INVENTION

The above objects have been met with a master oscillator power amplifier device having a steerable output beam. The MOPA device includes a tunable semiconductor diode laser oscillator, an amplifier disposed in tandem with the laser and a detuned second order grating output coupler disposed to receive amplified lightwaves from the amplifier, all disposed on a common monolithic substrate. Preferably, an array of phase controllers is disposed between the amplifier and the output coupler.

The semiconductor diode laser includes an active region for lightwave generation, a waveguide for propagation of the lightwaves and reflectors for providing feedback of the lightwaves. The laser's active region is electrically pumped with an injected current to generate the lightwaves. The laser waveguide may be capable of supporting propagation of only a single spatial mode. One or both of the laser reflectors may be distributed Bragg reflectors, and a tuning current may be injected into the waveguide below one of the Bragg reflectors to tune the selected wavelength of the laser lightwaves.

The amplifier can be a flared waveguide optically coupled to the laser. The amplifier is also pumped to provide an optical power gain to the lightwaves. Alternatively, the amplifier can include a power splitter network of branched single mode waveguides followed by a gain portion made up of an array of single mode waveguides. The power splitter is pumped to compensate for scattering and splitting losses at the branching Y-junctions and the gain portion is electrically pumped to provide an optical power gain to the lightwaves.

The array of phase controllers adjust for inhomogeneities and nonlinearities in the amplifier section and also provide lateral steering of the output beam by adjusting the optical path length by means of injecting charge carriers into the waveguides. The output coupler is a second order grating with a different period from the laser Bragg reflectors to provide a surface output slightly forward of the normal to the surface. Tuning the laser causes longitudinal steering of the beam.

BRIEF DESCRIPTION OF THE DRAWINGS

FIGS. 1-3 are respective perspective, top plan and side elevational views of a first embodiment of a master oscillator power amplifier device of the present invention.

FIGS. 4-5 are respective top plan and side elevational views of a second embodiment of a master oscillator power amplifier device of the present invention.

FIG. 6 is a perspective view of a third embodiment of a master oscillator power amplifier device of the present invention.

BEST MODE FOR CARRYING OUT THE INVENTION

With reference to FIGS. 1-3, an integrated master oscillator power amplifier (MOPA) of the present invention includes a wavelength tunable, single mode master oscillator 11, a flared waveguide power amplifier 13, a parallel array of lateral phase controllers 15 and a detuned, second-order grating, surface output coupler 17. The MOPA's elements 11, 13, 15 and 17 are integrated on a common monolithic substrate 19. An active region 21 of one or more thin layers associated with a semiconductor p-n junction is disposed over the substrate 19. Amplifier 13 is disposed in tandem following the master oscillator 11 and is optically coupled thereto. Likewise, output coupler 17 is disposed to receive the amplified lightwaves from amplifier 13. Phase controllers 15 are located between amplifier 13 and output coupler 17.

The master oscillator 11 is a semiconductor diode laser having active region 21 for lightwave generation and electrical surface contacts 29 and 31 for injecting current $I_m$ into, and thereby pumping, the active region 21 to generate the lightwaves. A waveguide 23 of two or more layers proximate to the active region 21 supports propagation of the lightwaves and a pair of distributed Bragg reflectors 25 and 27 along the waveguide 23 provides feedback of the lightwaves.

The laser waveguide 23 is typically a real refractive index waveguide approximately 5 $\mu$m wide. Waveguide 23 supports a single spatial mode at least to moderate power levels in the tens of milliwatts and preferably up to 100 mW.

Lasers require that feedback be provided at each end of the pumped gain section. The distributed Bragg reflectors 25 and 27 at each end of the waveguide 23, a center gain portion of which is pumped by current $I_m$, provide the feedback in the present embodiment and permit the direct integration of amplifier 13 with laser 11 without reflection from the amplifier 13. Reflectors 25 and 27 may be either first order or second order gratings. The most efficient feedback gratings are formed by matching the grating period to the first order Bragg condition of the laser light. For a GaAs active region 21, this requires a grating period on the order of 100 nm, which is somewhat difficult to fabricate. Easier and more reliable fabrication is obtained by using second order gratings. With second order gratings some of the light is coupled to radiation modes, which represent additional losses to the system, but if the losses in a particular embodiment are deemed to be significant a sub strate reflector, such as a multilayer dielectric stack, can be added to recover much of the lost light.

Front grating 27 is relatively short to enhance transmission to the power amplifier. An effective reflectivity of 30% or less is preferred. Front grating 27 provides a relatively broad band reflection because of its short length. Preferably, the modulation bandwidth of the laser 11 is about 0.5 to 3 GHz, thereby allowing a tunability over a range of about 5 nm. The rear grating 25 is relatively long to provide a high reflectivity. An effective reflectivity of 90% or more is preferred. Rear grating 25 because of its length provides a relatively narrow band reflection with strong frequency selectivity. The laser 11 thus is capable of supporting a single temporal mode to power levels up to at least 100 mW. The laser 11 can be tuned to select a specific frequency or wavelength by varying the amount of current $I_t$ injected into the device in the region of grating 25. Injecting current into a grating region reduces the index of refraction in that region, temporarily lengthening the wavelength of light propagating through that region, and thereby effectively shortening the grating period. Thus, increasing the tuning current $I_t$ causes a shift to shorter wavelengths.

The power amplifier 13 in FIGS. 1-3 consists of a flared, index-guided waveguide 31 with a broad area electrical contact 33 to supply current $I_a$ for the required gain. In order to maintain a planar phase front, the traveling wave mode must expand adiabatically to fill the wider aperture without diffracting. Accordingly, the flare angle $\theta$ is slightly less than the divergence of light from the master oscillator 11. For a 5 $\mu$m wide laser waveguide 23, the amplifier 13 has a waveguide 31 with a flare angle $\theta = 3°$. The amplifier length is limited by gain saturation and by noise due to amplified spontaneous emission, which competes with the injected signal for gain. A typical waveguide 31 of the present invention has a length of about 4 mm. The result of this flared waveguide 31 is that with a typical 25 mW input power from the oscillator 11, an approximately 30 dB small signal gain and 0.4 mW/cm$^2$ saturation intensity in the amplifier 13, and a 3° flare angle over a length of about 4 mm, the expected output power from amplifier 13 is about 1200 mW. A reason for this high power level is that most of the gain saturation occurs near the end of the amplifier 13 where the waveguide 31 is widest and power levels are highest. At the output end of the waveguide 31, its width is about 210 $\mu$m.

The gain saturation can be improved, as is well known, by use of multiple quantum wells in the active region 21 of the amplifier 13. For a 0.8 mW/cm$^2$ saturation intensity an expected output power of up to 2 Watts can be obtained. A similar increase in output power can also be achieved by altering the guiding parameters of waveguide 31 to increase the mode height of the optical field and thereby reduce the intensity in the waveguide 31.

An array 15 of parallel current-injecting electrodes follows the amplifier 13. The purpose of array 15 is not to provide additional gain, but rather to shape the output phase front. Thus, this array 15 of "phase controllers" is relatively short, about 1 mm. A potential drawback of the flared amplifier 13 is that as the waveguide 31 expands beyond the size of a single mode waveguide, phase and amplitude variations across the optical wave front can develop due to either material inhomogeneities, such as the presence of scattering centers and variations in epitaxial layer thicknesses, or optical nonlinearities, such as variations in the local propagation constant from temperature gradients and variations in charge carrier density. These variations distort the propagating wavefront and could induce coupling to higher order lateral modes. The phase controller array 15 can be used to compensate for and correct those distortions by adjusting the injection current $I_{\phi i}$ for each phase controller electrode in the array 15. As free carriers are injected into the material beneath array 15, the local refractive index beneath each electrode is lowered by an amount dependent on its injected current $I_{\phi i}$. This selectively reduces the optical path length so that the shape of the phase front can be straightened. Typically, an array of twenty phase controllers on 10 μm centers is used. As discussed below, this lateral phase control can also be used for lateral beam steering.

Following the phase control section 15 is a grating output coupler 17. Output coupler 17 is a second order grating which is detuned to a different period than the distributed Bragg reflectors 25 and 27 of the master oscillator 11. The grating length is typically about 500 μm. Several advantages result from this structure. In edge emitting MOPA designs of the prior art, the optical beam is coupled out from the cleaved facet of the amplifier. Feedback from this facet must be minimized to allow the amplifier to be operated at high gain without causing parasitic oscillations that could deteriorate the coherence of the device. Because the second order grating 17 is "detuned", that is its grating period does not match the incident wavelength, feedback is minimized. For a 5% change in grating period, the feedback is below $10^{-4}$ at typical operating wavelengths on the order of 800-900 nm. This is below that which is reliably attainable with high quality antireflection coatings. Reflections from the end 35 of the device can be eliminated by having an unpumped absorbing region 37 at the end of the grating 17. By proper choice of the grating depth, the aspect ratio of the output beam can be adjusted to 1:1. Further due to the larger emission area, thermal facet damage is eliminated. Another advantage resulting from use of a grating output coupler 17 is that the grating acts as a narrow band spectral filter for any noise introduced by the amplifier 13. The amplified spontaneous emission noise from the amplifier 13 is at a different wavelength, and thus is emitted in a different direction from the signal from the master oscillator 11.

Since the grating is of second order, light is coupled into an upward surface radiation 39. Since the grating is detuned, the surface radiation is at an angle from the normal given by $\Delta\lambda/\Lambda$, where $\Delta\lambda$ is the wavelength detuning from the couple grating period $\Lambda$. For $\Lambda > \lambda$, light is radiated forward of the normal. Since the surface coupled beam 39 is tilted slightly off the normal, feedback from surface reflections is essentially eliminated.

The output beam 39 is steerable in two dimensions. By tuning the master oscillator frequency via the rear reflector tuning current $I_t$, the amount of detuning of the grating 17 is varied, and hence the output beam is steered in the longitudinal direction 41, as shown by phantom beams 43. An alternate technique that can be used to steer the beam in the longitudinal direction is to keep the oscillator frequency constant while varying the period $\Lambda$ of the output grating 17. The period can be changed by injecting carriers into the waveguide portion 40 beneath grating 17, which change the refractive index of the material. However, due to the large size of the grating output coupler 17 compared to the rear oscillator grating 25, this alternate technique has the disadvantage of requiring more power to steer the beam than the preferred technique of tuning the oscillator 11. Steering in the lateral direction 45 is provided by the phase control array 15. Injecting progressively more current $I_{\phi i}$ toward one side of the array 15 than the other has the effect of tilting the phase front of the light so that, upon being coupled out from the surface of grating 17, the beam is directed toward the side with the lagging phase.

With reference to FIGS. 4 and 5, an alternative to the flared amplifier 13 may be used in a master oscillator power amplifier structure with detuned grating surface output coupler. In this structure, the flared amplifier 13 of FIGS. 1-3 is replaced by a network 53 of single mode waveguides 61 connected by Y-junctions 63, followed by an array 54 of amplifiers 65. As in the structure of FIGS. 1-3, the alternate structure includes a wavelength tunable master oscillator 51. The oscillator 51 is a diode laser with an active region 73 of one or more layers disposed on a substrate 75, a single mode waveguide 67 proximate to the active region and a pair of distributed Bragg reflectors 69 and 71, in the form of second order gratings, for providing feedback of lightwaves generated in the active region 73 and propagating along waveguide 67. A pump current $I_m$ is injected through the waveguide 67 into the active region 73 to generate the lightwaves, and a distinct tuning current $I_t$ is injected through the rear grating 69 to the underlying waveguide material to lower its index of refraction and effectively shorten the grating period of rear reflector 69.

The network 53 of branching single mode waveguides 61 is a power splitter which divides the propagating lightwaves from the laser oscillator 51 into multiple paths. In the embodiment shown in FIG. 4, there are 15 Y-junctions (of which 8 are shown) in 4 sets which divide the single waveguide path 67 of the laser oscillator 51 into 16 separate single mode waveguides 61 at the opposite end. The waveguides 61 are disposed proximate to the active region 73 on substrate 75. The active region 73 of the power splitter 53 is pumped via a broad area surface electrode 77 by a current $I_{ps}$ so as to compensate for the scattering and splitting losses at the Y-junctions 63. A linear array 54 of amplifiers 65 follows the power splitter 53 and provides high power output. Amplifiers 65 are single mode waveguides 79 disposed proximate to active region 73 on substrate 75 at the ends of power splitter waveguides 61.

Typically, there are about 16 waveguides 79 spaced apart laterally on 10 μm centers. Waveguides 79 are typically about 4 mm long, and are pumped via electrical contacts by an amplification current $I_n$. An advantage of this structure over the flared amplifier 13 of FIGS. 1-3, is the use of single mode waveguides 67, 61 and 79 throughout the device, which leads to better control over the amplified mode.

An array 55 of phase controller electrodes 81 follows amplifier 54 and injects currents $I_{\phi i}$ into underlying waveguide regions in order to adjust the phase of lightwaves from amplifier waveguides 79 so as to compensate for any differences in the light paths. The operation of array 55 is the same as that of array 15 in FIGS. 1-3, and like array 15, the array 55 provides lateral steering. A surface output coupler 57 in the form of a detuned second order grating follows the phase controller array 55. An unpumped absorbing region follows output coupler 57. The operation of output coupler 57 is identical to that of output coupler 17 in FIGS. 1-3. Longitudinal steering is provided preferably by wavelength tuning of the laser oscillator 51 with tuning current $I_t$ applied to rear grating 69.

In either embodiment, cooling requirements of the high power master oscillator power amplifier configurations may require that the structures be mounted top side down on a heat sink. In that case, the isolation of the distinct injection currents $I_m$, $I_t$, $I_{ps}$, $I_n$ and $I_{\phi i}$ can be provided on the substrate 75. Once the device is mounted on the heat sink, the substrate can be partially etched back to a thickness of just several micrometers. The surface output provided by gratings 17 and 57 is, in this case, through the substrate 75. Substrate absorption of the light output can be eliminated by forming the light emitting active region 73 of InGaAs instead of GaAs. The wavelength is thus shifted from about 830 nm to about 910 nm, and is transparent to the GaAs substrate.

With reference to FIG. 6, in a third embodiment of the present invention, an integrated master oscillator power amplifier device includes a master oscillator 91 followed by a sequential chain of amplifiers 93 and grating output couplers 95, all disposed in tandem on a common monolithic substrate 97. A substrate reflector 99, such as a dielectric reflector stack, may be disposed above substrate 97 to recover much of the light that is reflected toward the substrate by grating output couplers 95. At least one active region 100 is disposed on the substrate 97.

Master oscillator 91 is a semiconductor diode laser having at least one active region 100 for lightwave generation, an electrode contact 102 for injecting current into the active region 100 to generate the lightwaves, reflectors 103, such as a pair of distributed Bragg reflectors, for providing feedback of the light-waves, and a laser waveguide in layers 104 proximate to active region 100. The waveguide may be further defined through gain guiding with a stripe contact 102, although real refractive index waveguiding may also be used. One or both of the reflectors 103 may define the wavelength of the laser's light emission, and a tuning current could be injected into one of the reflector areas to tune the light output.

Amplifier 93 is disposed in tandem with laser 91 and includes active region 100, an electrode contact 105 for pumping the active region 100 to provide an optical power gain or "amplify" the lightwaves from the laser 91, and a waveguide in layers 104 proximate to the active region 100. The waveguide may be real refractive index, gain guiding, or both. An output coupler 95 includes a grating 107 disposed to receive the amplified lightwaves from amplifier 93. The grating period is different from any period which would provide significant reflection back to the laser 91, and in particular is different from the period provided to laser reflectors 103. As a result, light 109 is emitted from the surface of the output coupler 95. Tuning the laser 91 by altering the current injected into reflectors 103, will cause the beam output 109 to steer forward or backward by some angle $\theta$ from the direction 111 normal to the surface of the device. The effect is the same as that described above for the embodiment in FIGS. 1-3.

The device includes multiple amplifier-output coupler pairs disposed one after the other in tandem. In each pair a small amount of light 109 propagates forward to the next pair in the chain and is amplified by an amplifier before being emitted by an output coupler grating 107. Preferably, the gratings 107 all have the same period. Any number of pairs in the chain may be included up to a limit defined by a threshold for amplifier self-oscillation. Residual reflections of the amplifier-grating boundary, due to etching or carrier density gradients, lower the threshold for amplifier oscillation. In order to prevent instability in the master oscillator frequency, the chain length is limited. The limit may be determined experimentally for each configuration.

The devices described above are monolithically integrated master oscillator power amplifiers which have a high power output that is spatially and spectrally coherent. The devices produce two dimensionally electronically steerable beams, and thus are attractive optical sources for use in space-based laser communications and other applications.

We claim:

1. A master oscillator power amplifier device comprising
a semiconductor laser formed on a substrate for lightwave generation,
electrical means for exciting said laser,
amplifier means, formed on said substrate and positioned so as to accept light from said laser, for providing lightwave amplification,
electrical means for exciting said amplifier means,
a detuned grating output coupler disposed to receive said amplified lightwaves, said grating output coupler having a period which minimizes optical feedback into the amplifier means to the extent that said amplifier means does not oscillate, thereby producing a coherent single mode output beam.

2. The device of claim 1 wherein said laser is an electrically wavelength tunable distributed Bragg reflector laser.

3. The device of claim 1 wherein said laser is an electrically wavelength tunable distributed feedback laser.

4. The device of claim 1 wherein said laser includes a pair of grating reflectors.

5. The device of claim 1 wherein said laser includes a mirror reflector.

6. The device of claim 1 wherein said laser includes one grating reflector and one mirror.

7. The device of claim 1 wherein said laser is a single mode laser.

8. The device of claim 1 wherein amplifier means comprises an amplifier region.

9. The device of claim 1 wherein said amplifier means comprises multiple amplifier regions.

10. The device of claim 1 wherein said amplifier means supports only single mode propagation.

11. The device of claim 1 wherein said laser has an InGaAs active region and said substrate is GaAs.

12. The device of claim 1 further comprising alternating additional amplifier means for providing light amplification and grating output coupler, said amplifier means and grating output couplers being disposed on said substrate in tandem after the first grating output coupler, each of said amplifier means having electrical means for exciting said amplifier means, each of said grating output couplers providing an output beam and having a period which is different from any Bragg reflector period providing significant reflection back toward said laser.

13. A master oscillator power amplifier device comprising
a semiconductor laser formed on a substrate for lightwave generation,
electrical means for exciting said laser,
amplifier means, formed on said substrate and positioned so as to accept light from said laser, for providing lightwave amplification,
electrical means for exciting said amplifier means,
a grating output coupler disposed to receive said amplified lightwaves, said grating output coupler having a period which is different from any Bragg reflector period providing a significant reflection back to said laser, thereby producing a coherent single mode output beam, and
means for tuning a wavelength of light from said laser, whereby said output beam is spatially steered.

14. The device of claim 13 wherein said tuning means comprises means for varying a temperature of said laser.

15. The device of claim 13 wherein said tuning means comprises means for varying an electrical current supplied to said laser.

16. A master oscillator power amplifier device comprising,
a semiconductor diode laser having at least one active region for lightwave generation, electrical pump means for injecting current into said active region to generate said lightwaves, waveguide means for propagation of said lightwaves, and reflector means for providing feedback of said lightwaves,
amplifier means disposed in tandem with said laser for providing an optical power gain to said lightwaves, said amplifier means including an active region, a waveguide optically coupled to said laser to receive said lightwaves, and means for pumping said active region to amplify said lightwaves, said amplifier means integral with said laser on a common monolithic substrate, and
a grating output coupler disposed to receive said amplified lightwaves, said coupler having a grating period which is different from any Bragg reflector period providing significant reflection back to said laser, thereby producing a coherent single mode output beam.

17. The device of claim 16 further comprising,
means disposed between said amplifier and said output coupler for adjusting the relative phase between laterally adjacent portions of said lightwaves from said amplifier.

18. The device of claim 16 wherein said waveguide means of said laser and said waveguide of said amplifier means include waveguide regions proximate to said respective active regions of said laser and said amplifier means, said waveguide region of said amplifier means being optically coupled at one end to said laser.

19. The device of claim 16 wherein said waveguide means of said laser supports only a single spatial mode of propagation of said lightwaves.

20. The device of claim 16 wherein said reflector means of said laser includes at least one Bragg reflector.

21. The device of claim 16 wherein said laser has a tuning means for injecting current at said Bragg reflector means so as to shift a wavelength of said lightwaves.

22. The device of claim 16 wherein said waveguide of said amplifier means has an increasing width away from said laser.

23. The device of claim 16 wherein said active regions of said laser and said amplifier include InGaAs strain layers.

24. The device of claim 16 wherein a light absorbing region follows said output coupler.

25. The device of claim 16 further comprising additional amplifier means for providing an optical power gain to said lightwaves and additional grating output couplers disposed on said common monolithic substrate, said additional amplifier means and additional grating means alternating with one another in tandem following the first grating output coupler, each of said amplifier means including an active region, a waveguide optically coupled to a preceding grating output coupler to receive said lightwaves and means for pumping said active region to amplify said lightwaves, each of said grating output couplers being disposed amplified lightwaves from a preceding amplifier means and having a grating period which is different from any Bragg reflector period providing significant reflection back toward said laser, each grating output coupler producing an output beam.

26. The device of claim 16 wherein said amplifier means has a branching waveguide network coupled to an end of said laser by a linear array of amplifier sections, said waveguide network having a broad area current supply electrode, said linear array having plural independently addressable current electrodes.

27. A master oscillator power amplifier device comprising,
a semiconductor diode laser formed on a substrate, the laser having a waveguide supporting propagation of only a single spatial mode, the laser also having a pair of grating reflectors, a rear one of said grating reflectors being characterized by strong frequency selectivity, said laser being wavelength tunable with a variable tuning current injected through said rear reflector,
a flared index guided waveguide optically coupled to an output of said laser waveguide, said waveguide widening from input to output on an angle less than a divergence angle of light from said laser, said flared waveguide having a broad area electrical contact disposed proximate thereto so as to supply an amplification current thereto, said flared waveguide formed on said substrate monolithically with said laser, and
a second-order grating disposed to receive amplified light from said flared waveguide, said grating having a period different from that of said grating reflectors, thereby producing a coherent single mode output beam.

28. The device of claim 27 further comprising an array of phase control electrodes located on said substrate between said flared waveguide and said second-order grating, said arrays supplying a set of adjustable injection currents.

29. The device of claim 27 further comprising an unpumped absorbing region at an end of the second-order grating.

30. The device of claim 27 wherein said grating reflectors are first-order gratings.

31. The device of claim 27 wherein said grating reflectors are second-order gratings.

32. The device of claim 27 wherein a front one of said grating reflectors is a short broadband grating with at most 30% effective reflectivity.

33. The device of claim 27 wherein said substrate is GaAs and said laser has an InGaAs active region.

34. A master oscillator power amplifier device comprising, a semiconductor diode laser formed on a substrate, the laser having a waveguide supporting a single spatial mode of propagation, the laser also having a pair of grating reflectors, a rear one of the grating reflectors being characterized by strong frequency selectivity, said laser being wavelength tunable with a variable tuning current injected through said rear reflector, a network of branching single mode waveguides on said substrate connected by Y-junctions, said network optically coupled to the laser and dividing into multiple optical paths, a linear array of amplifiers on said substrate optically coupled to said multiple paths, said amplifiers being an array of electrically pumped single mode waveguides, and a grating output coupler disposed to receive amplified light from said linear array, said coupler having a grating period different from that of said grating reflectors of said laser, thereby producing an array of coherent single mode output beams.

35. The device of claim 34 further comprising means disposed between said linear array of amplifiers and said grating output coupler for adjusting the relative phase between laterally adjacent portions of lightwaves from said amplifiers.

36. The device of claim 34 further comprising an unpumped absorbing region at an end of said grating output coupler.

37. The device of claim 34 wherein said substrate is GaAs and said laser has an InGaAs active region.

38. The device of claim 34 wherein a front one of said grating reflectors is a short broadband grating with at most 30% effective reflectivity.

39. The device of claim 34 wherein said branching network is electrically pumpable via a broad area electrode.

40. A master oscillator power amplifier device comprising, a semiconductor diode laser disposed on a substrate, said laser having at least one active region for lightwave generation, a waveguide for propagation of said lightwaves, and a pair of grating reflectors, a rear one of said reflectors being characterized by strong frequency selection, said laser being wavelength tunable with a variable tuning current injected through said rear reflector, and a sequential chain of optical amplifiers and grating output couplers disposed in tandem on said substrate, each of said amplifiers including an active region, a waveguide, and means for pumping said active region to amplify said lightwaves, a first of said amplifiers being disposed in tandem with said laser and having said waveguide optically coupled to said laser to receive said lightwaves, the subsequent amplifiers having said waveguide optically coupled to a preceding grating output coupler, each grating output coupler being disposed to receive amplified lightwaves from a preceding amplifier, each grating output coupler having a grating period different from that of said grating reflectors of said laser, each grating output coupler thereby producing a coherent single mode output beam.

41. The device of claim 1 wherein said amplifier means is integral with said detuned grating output amplifier.

* * * * *